(12) United States Patent
Nguyen et al.

(10) Patent No.: US 9,871,520 B1
(45) Date of Patent: Jan. 16, 2018

(54) VOTING CIRCUIT AND SELF-CORRECTING LATCHES

(71) Applicant: Xilinx, Inc., San Jose, CA (US)

(72) Inventors: Chi M. Nguyen, San Jose, CA (US); Robert I. Fu, Saratoga, CA (US)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 15/237,439

(22) Filed: Aug. 15, 2016

(51) Int. Cl.
*H03K 19/003* (2006.01)
*H03K 19/177* (2006.01)
*H03K 3/356* (2006.01)

(52) U.S. Cl.
CPC . *H03K 19/00392* (2013.01); *H03K 3/356104* (2013.01); *H03K 19/17764* (2013.01)

(58) Field of Classification Search
None
See application file for complete search history.

(56) References Cited

U.S. PATENT DOCUMENTS

| | | | |
|---|---|---|---|
| 6,624,654 B1 | 9/2003 | Trimberger | |
| 6,686,763 B1* | 2/2004 | Yen | H03K 17/04206 326/26 |
| 7,523,371 B2* | 4/2009 | Mitra | G01R 31/318525 714/729 |
| 7,760,538 B1* | 7/2010 | Paak | G11C 11/412 365/148 |
| 8,519,483 B1* | 8/2013 | Hart | H01L 27/0207 257/368 |
| 9,191,009 B1 | 11/2015 | Clark et al. | |
| 2002/0074609 A1 | 6/2002 | Maruyama | |
| 2006/0015786 A1* | 1/2006 | Mitra | G01B 31/318536 714/724 |
| 2006/0044035 A1* | 3/2006 | Bertin | B82Y 10/00 327/202 |
| 2008/0062746 A1* | 3/2008 | Loh | G11C 7/02 365/154 |
| 2011/0157954 A1* | 6/2011 | Rimondi | G11C 11/412 365/72 |
| 2012/0299175 A1* | 11/2012 | Tran | B82Y 10/00 257/712 |
| 2013/0009664 A1 | 1/2013 | Golke | |
| 2013/0044543 A1* | 2/2013 | Kim | G11C 5/025 365/185.12 |
| 2014/0266436 A1* | 9/2014 | Lee | G11C 7/02 330/253 |
| 2016/0232968 A1* | 8/2016 | August | G11C 11/161 |

FOREIGN PATENT DOCUMENTS

CN 104901676 9/2015

* cited by examiner

Primary Examiner — Crystal L Hammond
(74) Attorney, Agent, or Firm — LeRoy D. Maunu (57) ABSTRACT

The disclosed voting circuit includes a pull-up circuit connected to an output node and to a positive supply voltage. A pull-down circuit is connected to the output node and to ground, and the output node is coupled to receive true output of a first bi-stable circuit. The pull-up circuit pulls the output node to the positive supply voltage in response to complementary output signals from second and third bi-stable circuits being in a first state, and the pull-down circuit pulls the output node to ground in response to complementary output signals from second and third bi-stable circuits being in a second state that is opposite the first state.

18 Claims, 5 Drawing Sheets

VOTING CIRCUIT AND SELF-CORRECTING LATCHES

TECHNICAL FIELD

The disclosure generally relates to voting circuits used in triple modular redundancy (TMR) circuits.

BACKGROUND

Programmable integrated circuits (ICs), such as field programmable gate arrays (FPGAs), are user configurable ICs capable of implementing various digital logic operations. FPGAs include programmable logic circuits such as configurable logic blocks (CLBs) arranged in rows and columns, input/output blocks (IOBs) surrounding the CLBs, and programmable interconnect lines that extend between the rows and columns of CLBs. The CLBs, IOBs, and interconnect lines are configured to implement a particular design according to configuration data stored in configuration memory cells of the programmable IC.

The versatility of programmable ICs is advantageous in applications, such as those requiring high availability, high reliability, or functional safety, where remote reconfiguration is preferred over physical replacement. However, with shrinkage of device geometry, atmospheric radiation can cause an error in a bi-stable circuit, which is known as a single event upset (SEU). When a single heavy ion strikes a silicon substrate, the ion loses energy through the creation of free electron hole pairs, resulting in a dense ionized track in the local region, and generating a current pulse that can upset the circuit. An SEU can also be caused by alpha particles. Alpha particles are generated when a neutron strikes a silicon substrate. The alpha particles travel through the substrate and generate charge clusters within a limited silicon volume. Alpha particles can be generated from high energy neutrons or from neutrons that have lost enough kinetic energy to be at thermal equilibrium with the operating environment. Alpha particles can also be generated through the decay of semiconductor packages that contain a small amount of radioactive contaminants.

In a programmable IC, an SEU may be of a configuration memory cell that is used to configure a programmable logic circuit. An SEU may additionally or alternatively induce errors by changing the value of a bi-stable circuit (e.g., a flip flop or latch) included in a user circuit design that is implemented by the programmable logic circuits. An error induced in configuration memory by an SEU may be referred to as a "configuration upset," and an error induced in a bi-stable circuit of a user circuit design may be referred to as a logic upset.

Configuration and logic upsets induced by SEUs can be mitigated by implementing three redundant instances of a circuit along with a voting circuit to ensure that a correct value is output when a logic or configuration upset occurs in one of the redundant instances. A circuit having three redundant instances of a circuit and a voting circuit is said to implement "triple modular redundancy" (TMR).

SUMMARY

A disclosed voting circuit includes a pull-up circuit connected to an output node and to a positive supply voltage and a pull-down circuit connected to the output node and to ground. The output node is coupled to receive true output of a first bi-stable circuit. The pull-up circuit is configured and arranged to pull the output node to the positive supply voltage in response to complementary output signals from second and third bi-stable circuits being in a first state, and the pull-down circuit is configured and arranged to pull the output node to ground in response to complementary output signals from second and third bi-stable circuits being in a second state that is opposite the first state.

A disclosed circuit arrangement includes first, second, and third voting circuits. The first voting circuit includes a pull-up circuit connected to a first output node and to a positive supply voltage and a pull-down circuit connected to the first output node and to ground. The pull-up circuit is configured and arranged to pull the first output node to the positive supply voltage in response to complementary output signals from second and third bi-stable circuits being in a first state. The pull-down circuit is configured and arranged to pull the first output node to ground in response to complementary output signals from second and third bi-stable circuits being in a second state that is opposite the first state. The second voting circuit includes a pull-up circuit connected to a second output node and to the positive supply voltage and a pull-down circuit connected to the second output node and to ground. The pull-up circuit of the second voting circuit configured and arranged to pull the second output node to the positive supply voltage in response to complementary output signals from the first and third bi-stable circuits being in a first state. The pull-down circuit of the second voting circuit is configured and arranged to pull the second output node to ground in response to complementary output signals from the first and third bi-stable circuits being in a second state that is opposite the first state. The third voting circuit includes a pull-up circuit connected to a third output node and to the positive supply voltage and a pull-down circuit connected to the third output node and to ground. The pull-up circuit of the third voting circuit is configured and arranged to pull the third output node to the positive supply voltage in response to complementary output signals from the first and second bi-stable circuits being in a first state. The pull-down circuit of the third voting circuit is configured and arranged to pull the third output node to ground in response to complementary output signals from the first and second bi-stable circuits being in a second state that is opposite the first state. The first, second, and third output nodes are coupled together.

A disclosed circuit arrangement includes a first bi-stable circuit, a second bi-stable circuit, a third bi-stable circuit, first and second transistors of a first type, and third and fourth transistors of a second type. The first transistor is serially connected to the second transistor, and the first transistor is serially coupled to a positive supply voltage. The third transistor is serially connected to the fourth transistor, the second transistor is serially connected to the third transistor at an output node, and the fourth transistor is serially coupled to ground. The output node is coupled to receive true output of the first bi-stable circuit. The gates of the first and third transistors are coupled to receive complementary output of the second bi-stable circuit, and the gates of the second and fourth transistors are coupled to receive complementary output of the third bi-stable circuit. An output signal line is connected to the output node, and a state of a signal on the output signal line is a state of a majority of true outputs of the first, second, and third bi-stable circuits.

Other features will be recognized from consideration of the Detailed Description and Claims, which follow.

BRIEF DESCRIPTION OF THE DRAWINGS

Various aspects and features of the circuitry will become apparent upon review of the following detailed description and upon reference to the drawings in which.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

A voting circuit for TMR is commonly implemented according to the following Boolean equation:

(Q1 AND Q2) OR (Q1 AND Q3) OR (Q2 AND Q3)

where Q1 is the true output of a first bi-stable circuit, Q2 is the true output of a second bi-stable circuit, and Q3 is the true output of a third bi-stable circuit. The implemented circuit would typically consume a total of four gates (three 2-input AND gates and one 3-input OR gate). The four gates can be implemented on 18 transistors.

As set forth in the description that follows, a voting circuit can be implemented with 4 transistors instead of the 18 transistors found in prior approaches. In addition, the voting circuit may be implemented to self-correct one or all three latches that provide the signals to be voted on. A circuit design may have thousands of instances of a voting circuit. Thus, a significant savings in transistor count can be realized by using the disclosed voting circuit.

The disclosed voting circuits include a pull-up circuit and a pull-down circuit. The pull-up circuit is connected to an output node and to a positive supply voltage, and the pull-down circuit is connected to the output node and to ground. The output node is also coupled to receive true output of a first bi-stable circuit. In response to complementary output signals from second and third bi-stable circuits being in a first state, the pull-up circuit pulls the output node to the positive supply voltage. In response to complementary output signals from second and third bi-stable circuits being in a second state that is opposite the first state, the pull-down circuit pulls the output node to ground. In implementations in which the bi-stable circuits are latches, if the latch having output coupled to the output node is in error, the latch may be self-corrected with suitably sized transistors in the pull-up and pull-down circuits. Other disclosed implementations provide self-correction of all three latches.

Figure 1:
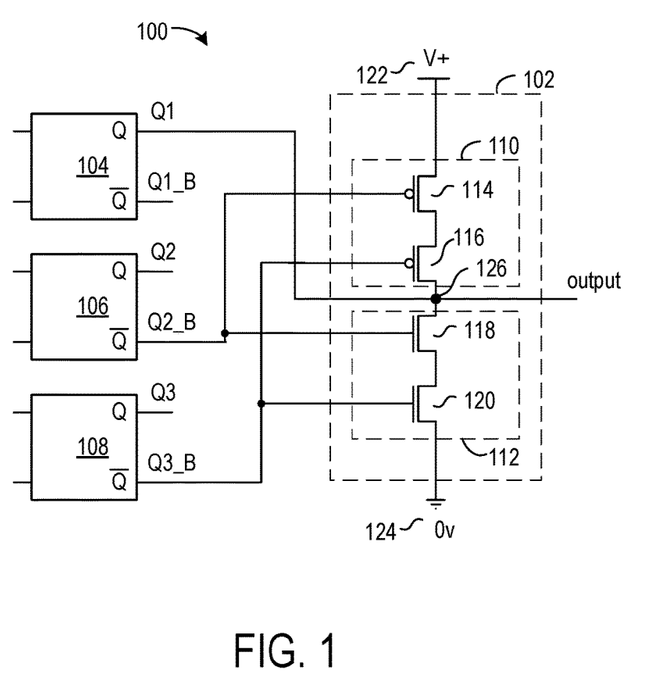
FIG. 1 shows a circuit arrangement in which a voting circuit is connected to three bi-stable circuits.

FIG. 1 shows a circuit arrangement 100 in which a voting circuit 102 is connected to three bi-stable circuits 104, 106, and 108. The voting circuit includes a pull-up circuit 110 and a pull-down circuit 112. The pull-up circuit includes serially connected PMOS transistors 114 and 116. The pull-down circuit includes serially connected NMOS transistors 118 and 120. The pull-up circuit is connected to the positive supply voltage 122, and the pull-down circuit is connected to ground 124. The true output, Q1, of bi-stable circuit 104 is coupled to the output node 126, and the gates of the PMOS transistors 114 and 116 of the pull-up circuit 110 and gates of the NMOS transistors 118 and 120 are coupled to receive the complementary outputs, Q2_B and Q3_B of the bi-stable circuits 106 and 108. In response to the complementary output signals Q2_B and Q3_B from second and third bi-stable circuits being logic 0, the pull-up circuit pulls the output node 126 to the positive supply voltage. In response to the complementary output signals Q2_B and Q3_B being logic 1, the pull-down circuit pulls the output node to ground.

In operating as a voting circuit, if Q1, Q2, and Q3 are all logic 1, the output node 126 is driven to logic 1 by Q1 and is also pulled up to the positive supply voltage. If Q1, Q2, and Q3 are all logic 0, the output node is driven to logic 0 by Q1 and is also pulled down to ground. If the bi-stable circuit 104 is corrupt and bi-stable circuits 106 and 108 are not corrupt, the output node will be pulled to the correct state by either the pull-up circuit 110 or pull-down circuit 112. If the bi-stable circuit driving either of Q2 or Q3 is flipped to the wrong state, the pull-up and pull-down paths are both turned off, and the output node is driven by Q1 (Q1 will match the uncorrupted one of Q2 or Q3).

The voting circuit 102 can be used with either latches or flip-flops as the bi-stable circuits 104, 106, and 108. In implementations in which the bi-stable circuits are latches, the voting circuit can self-correct the latch that is connected to the output node if the latch is corrupt. The self-correction may be implemented by suitably sizing the transistors 114, 116, 118, and 120 in the pull-up and pull-down circuits. Larger transistors provide more pull than would smaller transistors.

In an implementation in which the bi-stable circuits are flip-flops, the output node can be connected to the true output Q of the slave stage of the flip-flop. The voting circuit would not self-correct the flip-flop.

Those skilled in the art will recognize that an equivalent voting circuit may be realized by inverting the logic of voting circuit 102. That is, the output node 126 may be connected to the complementary output Q1_13 of the bi-stable circuit 104, and the gates of the transistors 114, 116, 118 and 120 may be connected to the true outputs Q2 and Q3 of the bi-stable circuits 106 and 108.

The voting circuit may be extended to accommodate more than three bi-stable circuits. However, the disclosed TMR voting circuit addresses SBEs, and the cost of resolving multi-bit errors with larger circuitry may be greater than the benefit.

Figure 2:
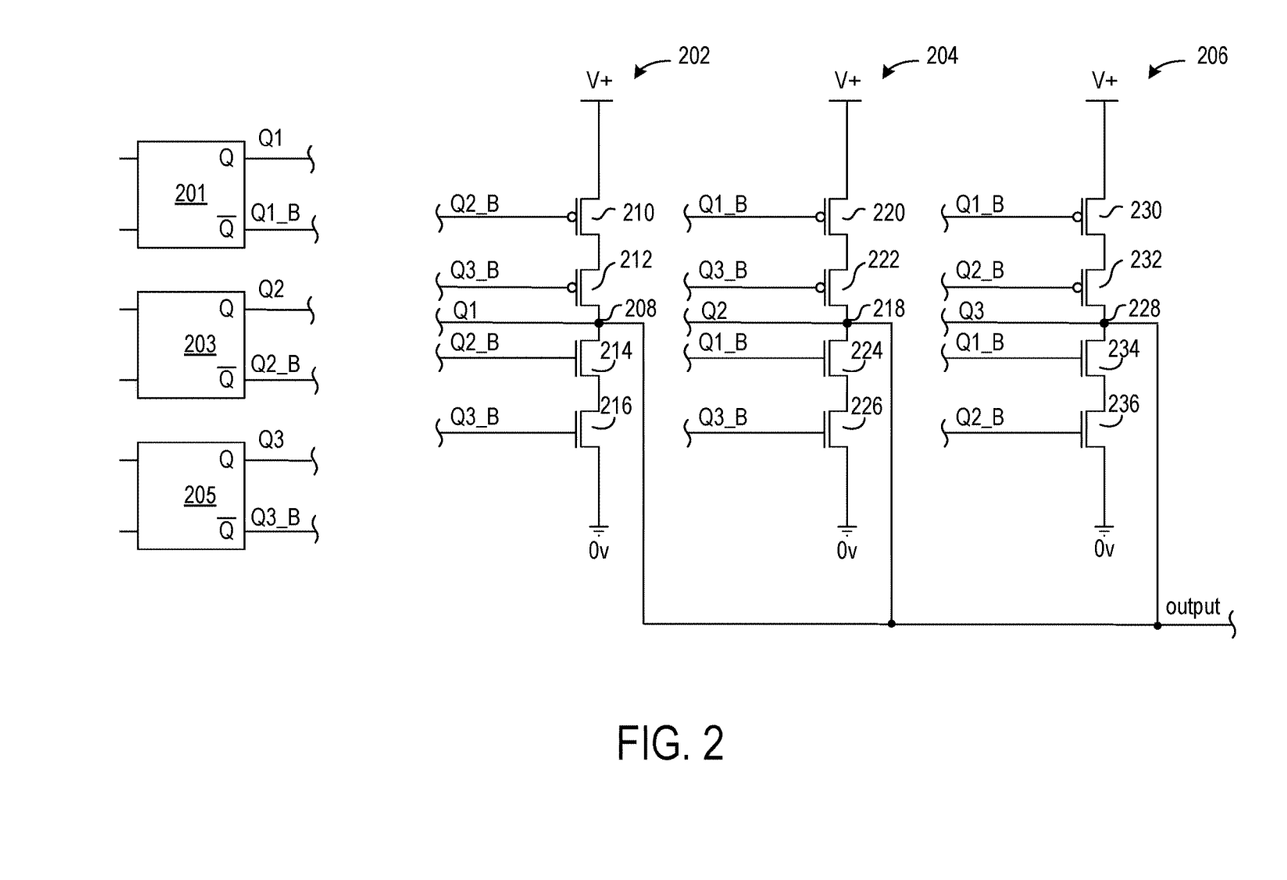
FIG. 2 shows a circuit diagram of a circuit arrangement in which any of the three latches may be self-corrected.

FIG. 2 shows a circuit diagram of a circuit arrangement in which any of the three latches may be self-corrected. In response to any of the three latches 201, 203, and 205 being upset, one of the voting circuits 202, 204, and 206 corrects the upset latch.

The output node 208 of the first voting circuit 202 is coupled to receive the true output Q1 from latch 201, and the gates of the PMOS transistors 210 and 212 and NMOS transistors 214 and 216 are coupled to receive the complementary outputs Q2_B and Q3_B of latches 203 and 205. The output node 218 of the second voting circuit 204 is coupled to receive the true output Q2 from latch 203, and the gates of the PMOS transistors 220 and 222 and NMOS transistors 224 and 226 are coupled to receive the complementary outputs Q1_B and Q3_B of latches 201 and 205.

The output node 228 of the third voting circuit 206 is coupled to receive the true output Q3 from latch 205, and the gates of the PMOS transistors 230 and 232 and NMOS transistors 234 and 236 are coupled to receive the complementary outputs Q1_B and Q2_B of latches 201 and 203. The output nodes are connected to the output signal line.

Figure 3:
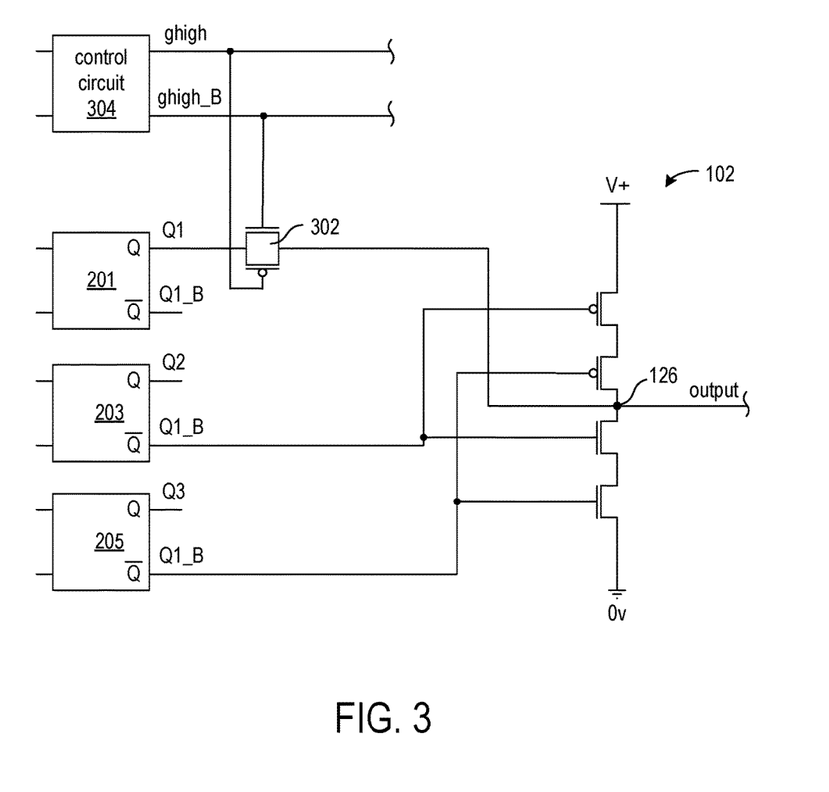
FIG. 3 shows a circuit diagram of a circuit arrangement that provides control for preventing contention in writing to the latches where only one of the latches is self-correcting.

FIG. 3 shows a circuit diagram of a circuit arrangement that provides control for preventing contention in writing to the latches where only one of the latches is self-correcting. In order to prevent contention between the bi-stable circuits when implemented as latches, the latches are written simultaneously. However, for purposes such as verification or encryption, writing different values to the latches may be desirable.

A transmission gate 302 is connected between the true output Q1 of latch 201 and the output node 126 of the voting circuit 102 in order to control self-correction of the latch 201 by the voting circuit. The control gates of the transmission gate 302 are coupled to the control circuit 304, which generates complementary signals ghigh and ghigh_B. The control circuit 304 may be state machine or microcontroller circuit that is on the same IC die or on an external IC die on which the voting circuit 102 is implemented. When ghigh is logic 1 and ghigh_B is logic 0, latches 201, 203, and 205 may be configured with different values.

Figure 4:
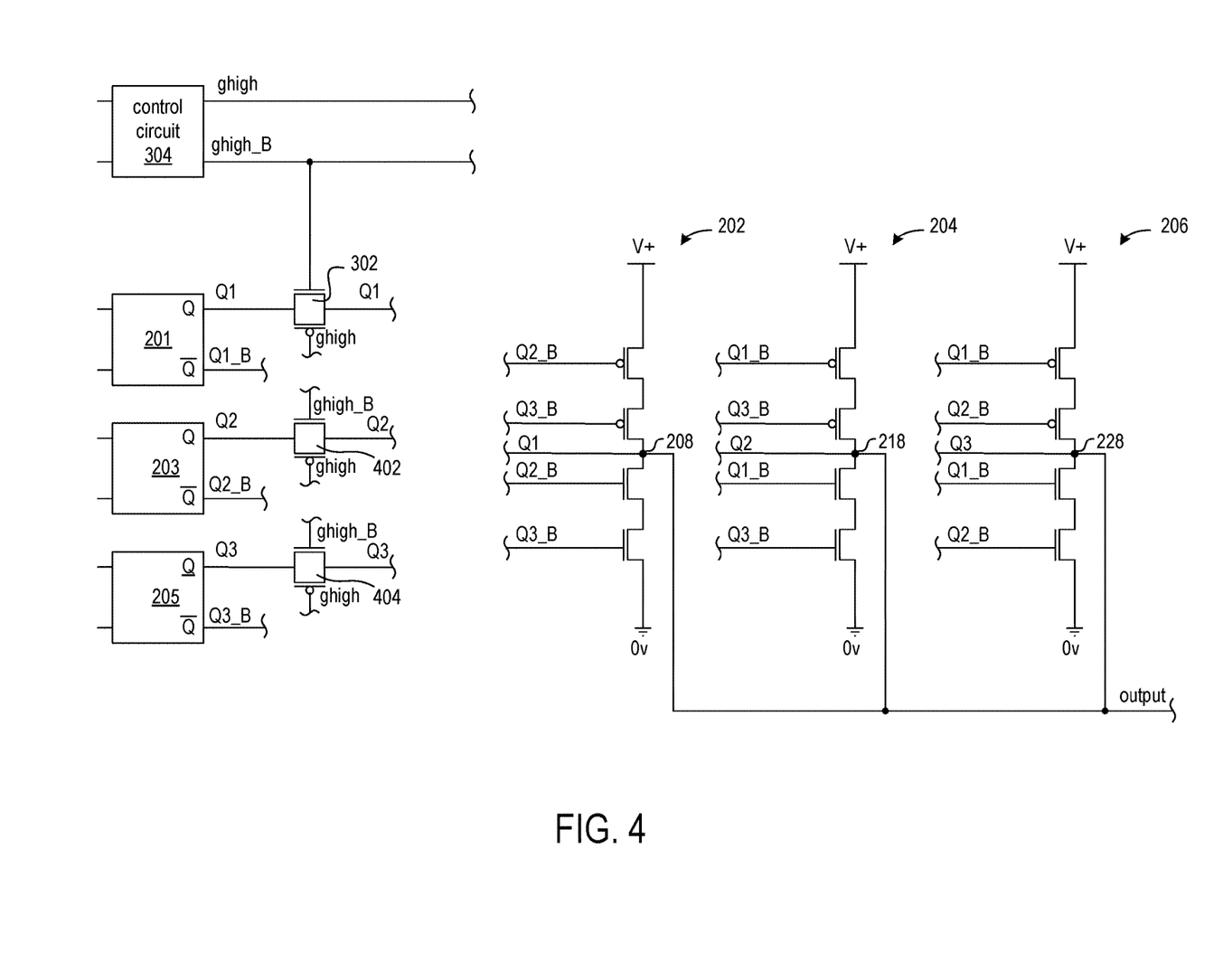
FIG. 4 shows a circuit diagram of a circuit arrangement in which all three latches are self-correcting by the voting circuits, and control is provided for preventing contention in writing different values to the latches.

FIG. 4 shows a circuit diagram of a circuit arrangement in which all three latches 201, 203, and 205 are self-correcting by the voting circuits 202, 204, and 206, and control is provided for preventing contention in writing different values to the latches.

Transmission gate 302 is connected between the true output of latch 201 and output node 208, transmission gate 402 is connected between the true output of latch 203 and the output node 218, and transmission gate 404 is connected between the true output of latch 206 and the output node 228.

The control gates of the transmission gate 302, transmission gate 402, and transmission gate 404 are coupled to the complementary signals of control circuit 304. When ghigh is logic 1 and ghigh_B is logic 0, latches 201, 203, and 205 may be configured with different values. For example, when the device having the latches and voting circuit is in configuration mode, the transmission gate controlled by ghigh is off and there is no interaction between outputs of the latches, which permits writing different values of the latches or the same value at different times. When the device having the latches and voting circuit is operating with TMR circuit, the transmission gate controlled by ghigh is on and the latches are forced to have the same value. If any of the latches is upset to a state that is different from the other two latches, the upset latch will be corrected to the proper state by the pull-up or pull-down controlled by the other two latches.

Figure 5:
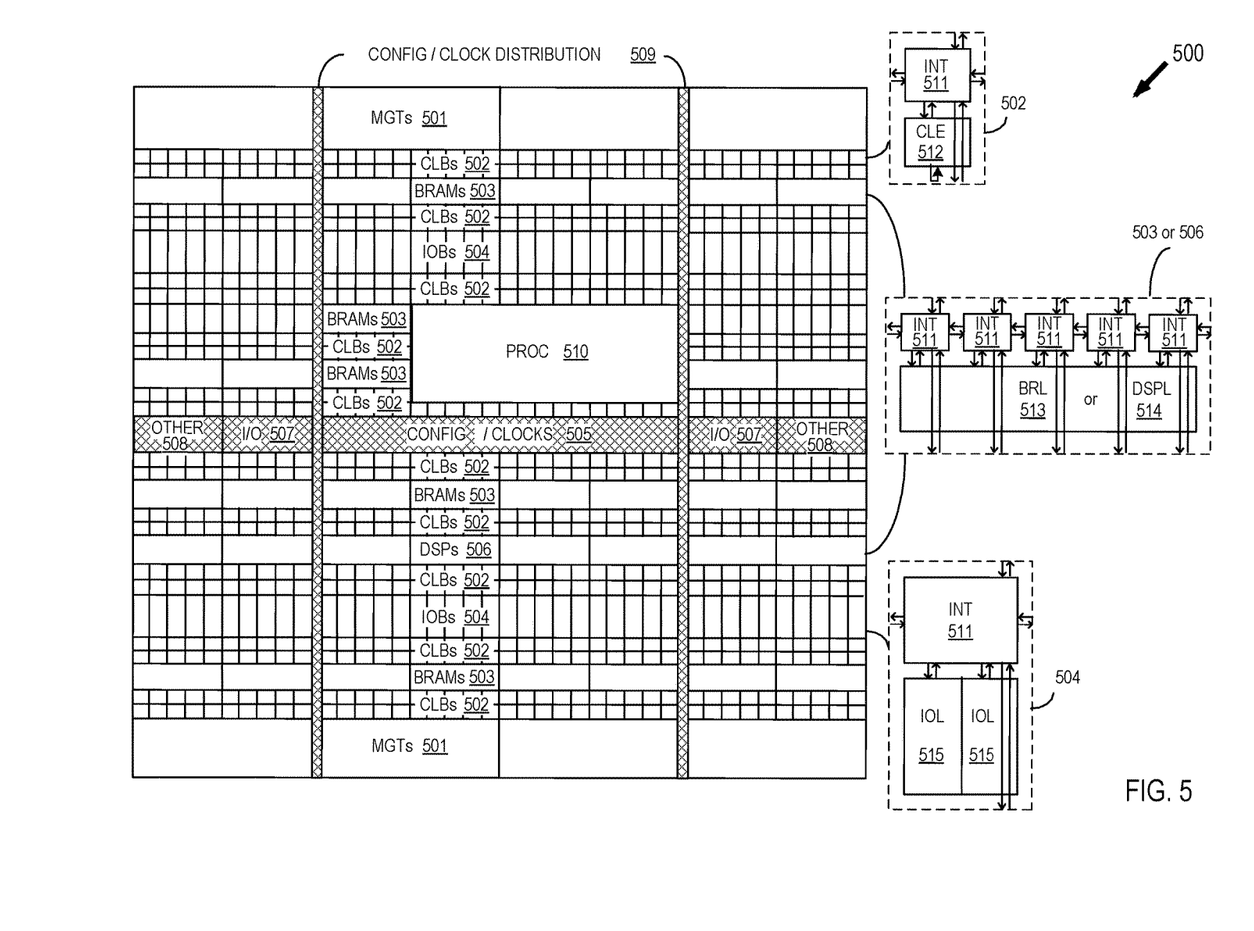
FIG. 5 shows a programmable integrated circuit (IC) on which the disclosed circuits and processes may be implemented.

FIG. 5 shows a programmable integrated circuit (IC) 500 on which the disclosed circuits and processes may be implemented. The programmable IC may also be referred to as a System On Chip (SOC) that includes field programmable gate array logic (FPGA) along with other programmable resources. FPGA logic may include several different types of programmable logic blocks in the array. For example, FIG. 5 illustrates programmable IC 500 that includes a large number of different programmable tiles including multi-gigabit transceivers (MGTs) 501, configurable logic blocks (CLBs) 502, random access memory blocks (BRAMs) 503, input/output blocks (IOBs) 504, configuration and clocking logic (CONFIG/CLOCKS) 505, digital signal processing blocks (DSPs) 506, specialized input/output blocks (I/O) 507, for example, clock ports, and other programmable logic 508 such as digital clock managers, analog-to-digital converters, system monitoring logic, and so forth. Some programmable IC having FPGA logic also include dedicated processor blocks (PROC) 510 and internal and external reconfiguration ports (not shown).

In some FPGA logic, each programmable tile includes a programmable interconnect element (INT) 511 having standardized connections to and from a corresponding interconnect element in each adjacent tile. Therefore, the programmable interconnect elements taken together implement the programmable interconnect structure for the illustrated FPGA logic. The programmable interconnect element INT 511 also includes the connections to and from the programmable logic element within the same tile, as shown by the examples included at the top of FIG. 5.

For example, a CLB 502 can include a configurable logic element CLE 512 that can be programmed to implement user logic, plus a single programmable interconnect element INT 511. A BRAM 503 can include a BRAM logic element (BRL) 513 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 506 can include a DSP logic element (DSPL) 514 in addition to an appropriate number of programmable interconnect elements. An 10B 504 can include, for example, two instances of an input/output logic element (IOL) 515 in addition to one instance of the programmable interconnect element INT 511. As will be clear to those of skill in the art, the actual I/O bond pads connected, for example, to the I/O logic element 515, are manufactured using metal layered above the various illustrated logic blocks, and typically are not confined to the area of the input/output logic element 515. The states of configuration memory cells (not shown) of the programmable IC specify the logic implemented by the CLEs 512, the interconnections of the INTs 511, and configurations of the IOLs 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 5 include additional logic blocks that disrupt the regular columnar structure making up a large part of the programmable IC. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The disclosed circuitry is thought to be applicable to a variety of systems for TMR applications. Other aspects and features will be apparent to those skilled in the art from consideration of the specification. It is intended that the specification and drawings be considered as examples only, with a true scope of the invention being indicated by the following claims.

What is claimed is:

1. A voting circuit, comprising:
   a pull-up circuit connected to an output node and to a positive supply voltage;
   a pull-down circuit connected to the output node and to ground;
   the output node coupled to receive true output of a first bi-stable circuit;
   a transmission gate connected between the true output of the first bi-stable circuit and the output node;
   the pull-up circuit configured and arranged to pull the output node to the positive supply voltage in response to complementary output signals from second and third bi-stable circuits being in a first state; and
   the pull-down circuit configured and arranged to pull the output node to ground in response to complementary output signals from second and third bi-stable circuits being in a second state that is opposite the first state.

2. The voting circuit of claim 1, further comprising a control circuit coupled to control gates of the transmission gate and configured and arranged to connect and disconnect the output node from the true output of the first bi-stable circuit.

3. The voting circuit of claim 1, wherein the pull-up circuit includes transistors of a first type, and the pull-down circuit includes transistors of a second type that is different from the first type.

4. The voting circuit of claim 3, wherein the first type is PMOS, and the second type is NMOS.

5. The voting circuit of claim 1, wherein the first, second, and third bi-stable circuits are configuration memory cells of a programmable IC.

6. A circuit arrangement, comprising:
   a first voting circuit, the first voting circuit including:
      a pull-up circuit connected to a first output node and to a positive supply voltage,
      a pull-down circuit connected to the first output node and to ground,
      the pull-up circuit configured and arranged to pull the first output node to the positive supply voltage in response to complementary output signals from second and third bi-stable circuits being in a first state, and
      the pull-down circuit configured and arranged to pull the first output node to ground in response to complementary output signals from second and third bi-stable circuits being in a second state that is opposite the first state;
   a second voting circuit, the second voting circuit including:
      a pull-up circuit connected to a second output node and to the positive supply voltage,
      a pull-down circuit connected to the second output node and to ground,
      the pull-up circuit configured and arranged to pull the second output node to the positive supply voltage in response to complementary output signals from the first and third bi-stable circuits being in a first state, and
      the pull-down circuit configured and arranged to pull the second output node to ground in response to complementary output signals from the first and third bi-stable circuits being in a second state that is opposite the first state; and
   a third voting circuit, the third voting circuit including:
      a pull-up circuit connected to a third output node and to the positive supply voltage,
      a pull-down circuit connected to the third output node and to ground,
      the pull-up circuit configured and arranged to pull the third output node to the positive supply voltage in response to complementary output signals from the first and second bi-stable circuits being in a first state, and
      the pull-down circuit configured and arranged to pull the third output node to ground in response to complementary output signals from the first and second bi-stable circuits being in a second state that is opposite the first state wherein the first, second, and third output nodes are coupled together.

7. The circuit arrangement of claim 6, further comprising:
   a first transmission gate connected between a true output of the first bi-stable circuit and the first output node;
   a second transmission gate connected between a true output of the second bi-stable circuit and the second output node; and
   a third transmission gate connected between a true output of third bi-stable circuit and the third output node.

8. The circuit arrangement of claim 7, further comprising a control circuit coupled to control gates of the first, second, and third transmission gates and configured and arranged to connect and disconnect the first, second, and third output nodes from the true outputs of the first, second, and third bi-stable circuits, respectively.

9. The circuit arrangement of claim 6, wherein the pull-up circuit of the first voting circuit, the pull-up circuit of the second voting circuit, and the pull-up circuit of the third voting circuit include transistors of a first type, and the pull-down circuit of the first voting circuit, the pull-down circuit of the second voting circuit, and the pull-down circuit of the third voting circuit include transistors of a second type that is different from the first type.

10. The circuit arrangement of claim 9, wherein the first type is PMOS, and the second type is NMOS.

11. The circuit arrangement of claim 6, wherein the first, second, and third bi-stable circuits are configuration memory cells of a programmable IC.

12. A circuit arrangement, comprising:
   a first bi-stable circuit;
   a second bi-stable circuit;
   a third bi-stable circuit;
   a first transistor of a first type serially connected to a second transistor of the first type, wherein the first transistor is serially coupled to a positive supply voltage;
   a third transistor of a second type serially connected to a fourth transistor of the second type, wherein the second transistor is serially connected to the third transistor at an output node, and the fourth transistor is serially coupled to ground;
   a transmission gate connected between the true output of the first bi-stable circuit and the output node;
   wherein:

the output node is coupled to receive true output of the first bi-stable circuit;

gates of the first and third transistors are coupled to receive complementary output of the second bi-stable circuit;

gates of the second and fourth transistors coupled to receive complementary output of the third bi-stable circuit; and an output signal line connected to the output node, wherein a state of a signal on the output signal line is a state of a majority of true outputs of the first, second, and third bi-stable circuits.

13. The circuit arrangement of claim 12, further comprising a control circuit coupled to control gates of the transmission gate and configured and arranged to connect and disconnect the output node from the true output of the first bi-stable circuit.

14. The circuit arrangement of claim 12, wherein the first type is PMOS, and the second type is NMOS.

15. The circuit arrangement of claim 12, wherein the first, second, and third bi-stable circuits are latches.

16. The circuit arrangement of claim 12, wherein the first, second, and third bi-stable circuits are configuration memory cells of a programmable IC.

17. The circuit arrangement of claim 16, wherein the first, second, and third bi-stable circuits are latches.

18. The circuit arrangement of claim 16, further comprising a transmission gate connected between the true output of the first bi-stable circuit and the output node.

\* \* \* \* \*